United States Patent

Min

Patent Number: 5,703,497
Date of Patent: Dec. 30, 1997

[54] CURRENT SOURCE RESPONSIVE TO SUPPLY VOLTAGE VARIATIONS

[75] Inventor: Sung-Ki Min, Cupertino, Calif.

[73] Assignee: Integrated Device Technology, Inc., Santa Clara, Calif.

[21] Appl. No.: 686,007

[22] Filed: Jul. 25, 1996

Related U.S. Application Data

[62] Division of Ser. No. 442,725, May 17, 1995.

[51] Int. Cl.$^6$ .......................... H03K 3/011; H03K 19/086
[52] U.S. Cl. ........................ 326/33; 327/538; 326/126
[58] Field of Search ............................ 326/31, 32, 33, 326/34, 126; 327/535, 538, 543

[56] References Cited

U.S. PATENT DOCUMENTS

| | | | |
|---|---|---|---|
| 4,270,081 | 5/1981 | Hareyama | 327/535 |
| 4,361,797 | 11/1982 | Kojima et al. | 327/535 |
| 4,794,317 | 12/1988 | van Tran | 326/66 |
| 4,797,583 | 1/1989 | Ueno et al. | 326/66 |
| 4,906,871 | 3/1990 | Iida | 326/66 |
| 4,912,347 | 3/1990 | Morris | 326/34 |
| 4,918,336 | 4/1990 | Graham et al. | 326/31 |
| 5,072,136 | 12/1991 | Naghshineh | 326/33 |
| 5,287,019 | 2/1994 | Nonaka et al. | 326/66 |
| 5,300,837 | 4/1994 | Fischer | 327/538 |
| 5,428,303 | 6/1995 | Pasqualini | 326/31 |
| 5,465,057 | 11/1995 | Takahashi | 326/66 |

OTHER PUBLICATIONS

Sedra et al.; "Microelectronics Circuits", 2nd Edition; copyright 1987 (no month available) by Holt, Rinehart and Winston, Inc.; pp. 378–379.

*Primary Examiner*—Edward P. Westin
*Assistant Examiner*—Benjamin D. Driscoll
*Attorney, Agent, or Firm*—Skjerven, Morrill, MacPherson, Franklin & Friel

[57] ABSTRACT

A current source varies the bias current to a differential amplifier according to fluctuations in the supply voltage. In this manner, the operating point of the differential amplifier is automatically adjusted to compensate for variations in the supply voltage. Adjusting bias current in this manner provides for a reduction in power dissipation. The current supply is coupled to the differential amplifier in such a manner that a current mirror is not required to be connected between the differential amplifier and the inverter. Eliminating the need for such a current mirror is advantageous in reducing the number of gate delays and thereby increasing the speed of a level translator to which the current source is coupled.

6 Claims, 3 Drawing Sheets

CURRENT SOURCE RESPONSIVE TO SUPPLY VOLTAGE VARIATIONS

This application is a division of application Ser. No. 08/442,725, filed May 17, 1995.

FIELD OF THE INVENTION

This invention relates to integrated circuit level translators. More particularly, this invention relates to a high speed level translator.

BACKGROUND OF THE INVENTION

BiCMOS technology allows circuit designers to combine the high speed of bipolar transistors with the high density and low power dissipation of CMOS transistors. BiCMOS technology is especially suitable for the implementation of memory elements such as SRAMs. In a typical SRAM, CMOS devices are utilized for the memory core to allow for high component densities while bipolar devices are utilized for the high speed peripheral logic and sensing circuitry. In such an SRAM, it is necessary to properly interface the bipolar peripheral circuits with the CMOS core devices. A circuit which converts a signal from one level to another (i.e., from a bipolar signal level to a CMOS signal level) is commonly called a level translator.

A conventional BiCMOS level translator 10 is shown in FIG. 1. NPN transistors Q1 and Q2 form a differential amplifier which is biased by constant current source $I_1$. The collectors of transistors Q1 and Q2 are connected to a supply voltage $V_{cc}$ through resistors R1 and R2, respectively. An ECL (emitter coupled logic) differential input signal is provided to translator 10 at the bases of NPN transistors Q1 and Q2, amplified by transistors Q1 and Q2, and provided as a differential input to current mirror 12. NPN transistors Q3 and Q4, which are biased by constant current sources $I_2$ and $I_3$, respectively, operate as emitter followers and act as a buffer between differential pair Q1 and Q2 and current mirror 12.

Current mirror 12 includes PMOS transistors MP1 and MP2 and NMOS transistors MN1 and MN2. Current mirror 12 receives the amplified differential input signal at the gates of transistors MP1 and MP2 and provides a single ended signal to inverter 16 on line 14. Transistors MN1 and MN2 form a current mirror such that the current flowing through transistor MN1 is equal to the current flowing through transistor MN2. The current in line 14, which is given by the expression $I_{14}=I_{MP2}-I_{MP1}$, is a transient current indicative of the differential input signal and is provided as an input to inverter 16. An output signal indicative of the polarity of the differential input signal is provided at node 18. This output signal may swing between approximately $V_{cc}$ (i.e., $V_{cc}-V_{be}$ (Q5)) and ground potential and is thus consistent with BiCMOS signal levels.

Conventional level translator 10 has several disadvantages. First, current mirror 12 of translator 10 consumes an undesirably large amount of power. When the emitter of transistor Q3 is low, transistor MP1 turns on and creates a DC current path between $V_{cc}$ and ground via transistor MN1 and accounts for a significant portion of the total power consumption of level translator 10. Further, each level translator 10 undesirably requires its own current mirror 12. Thus, in applications which require a large number of level translators 10, the total power dissipation will rapidly increase as the number of level translators 10 increases. Moreover, current mirror 12 adds additional delays to translator 10 and thereby reduces the speed of translator 10.

SUMMARY

In accordance with the present invention, an improved BiCMOS level translator provides an effective translation of signals from ECL levels to BiCMOS levels at an increased speed and at a reduced level of power dissipation compared to the prior art since embodiments in accordance with the present invention do not require a current mirror connected between the differential input stage and the output inverter. In accordance with the present invention, a differential amplifier configured to provide a single ended intermediate signal is connected between a pair of differential input terminals and an inverter circuit. An ECL differential input signal applied to the input terminals is amplified by the differential amplifier and provided as a single ended intermediate signal to the inverter circuit. The inverter circuit outputs a BiCMOS-level signal indicative of the polarity of the ECL differential input signal. The inverter circuit and differential amplifier are buffered with an emitter follower transistor.

Providing the single-ended intermediate signal directly from the differential amplifier to the inverter circuit eliminates the need for a current mirror interposed between the differential amplifier and the inverter circuit, as required in the prior art level translator 10 of FIG. 1. Accordingly, circuit delays attributable to such a current mirror are eliminated and, as a result, the speed of the present level translator is increased.

The differential amplifier is biased with a self-adjusting bias circuit which varies the bias current according to fluctuations in the supply voltage, i.e., the operating point of the differential amplifier is automatically adjusted to compensate for variations in the supply voltage. Adjusting the bias current in such a manner allows for the voltage limits of the single-ended intermediate signal to be adjusted, thereby optimizing performance of the inverter circuit.

In accordance with the present invention, a single bias circuit such as the one described above may be shared among many of the present level translators, i.e., a single bias circuit may be used to bias the differential amplifiers of more than one level translator. This sharing feature, as well as the elimination of the current mirror discussed above, results in significant savings in valuable die area for applications which require multiple level translators.

This sharing feature also results in a reduction in total power consumption of applications which require multiple level translators. A significant portion of the total power consumption of the present level translator is attributable to losses within the bias circuit. Thus, in applications which require many level translators, power dissipation attributable to the bias circuit may be shared, or spread among, the many level translators. As the number of level translators used within a particular application increases, the savings in power consumption become more significant.

DETAILED DESCRIPTION

Figure 2:
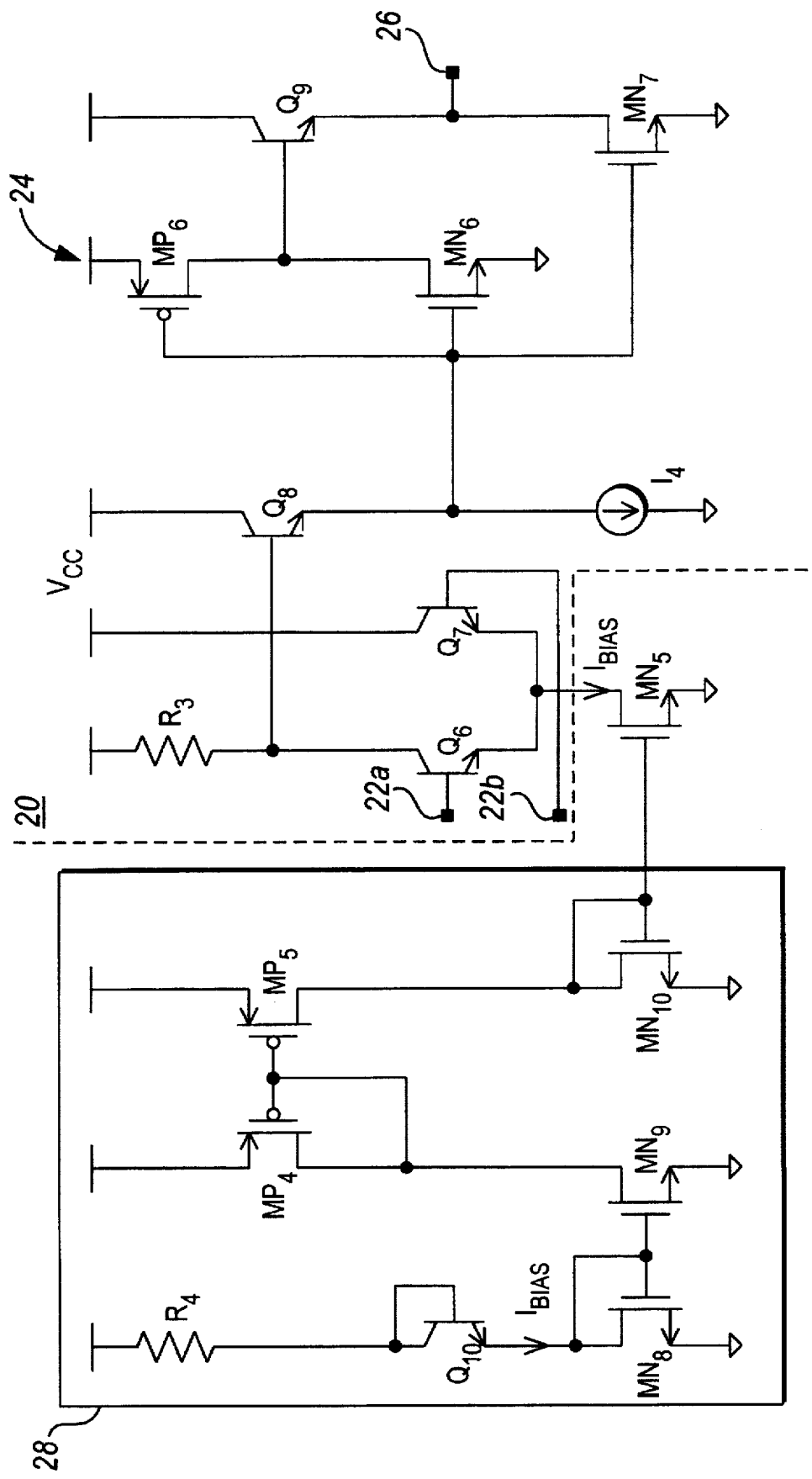
FIG. 2 is a schematic diagram of a BiCMOS level translator in accordance with the present invention.

A level translator 20 in accordance with this invention is shown in FIG. 2. NPN transistors Q6 and Q7 operate as a differential pair and have their bases connected to input terminals 22a and 22b, respectively. The collector of transistor Q7 is connected to $V_{cc}$. The collector of transistor Q6 is connected to $V_{cc}$ through resistor R3 and is also connected to the base of NPN transistor Q8. Transistor Q8 is biased by a constant current source $I_4$. The emitter of transistor Q8 is connected to an inverter 24, which includes P-channel MOS transistor MP6 connected in series with N-channel MOS transistor MN6, NPN transistor Q9, the base of which is connected to the node between MP6 and MN6, and MOS transistor MN7 connected between the emitter of Q9 and ground potential. The gates of MP6, MN6, and MN7 are driven by the voltage on the emitter of Q8. An output terminal 26 is connected to the emitter of transistor Q9.

An ECL differential input signal is applied to translator 20 at input terminals 22a and 22b. Transistors Q6 and Q7 amplify the differential input signal and provide a single-ended intermediate signal at the collector of transistor Q6. This intermediate signal is provided to inverter 24 via buffer transistor Q8. Inverter 24 inverts the intermediate signal and produces, at output terminal 26, a BiCMOS-level output signal indicative of the polarity of the ECL differential input signal. Transistor Q8 operates as an emitter follower and serves as a buffer between inverter 24 and differential pair transistors Q6 and Q7.

Differential pair transistors Q6 and Q7 are biased by biasing circuit 28. A bias current $I_{bias}$ is developed by resistor R4 and diode-connected NPN transistor Q10. Resistor R4 has a resistance equal to that of resistor R3. In the preferred embodiment, N-channel MOS transistors MN8 and MN9 have equal cross-sectional areas, P-channel MOS transistors MP4 and MP5 have equal cross-sectional areas, N-channel MOS transistors MN10 and MN5 have equal cross-sectional areas, and all operate in saturation. $I_{bias}$ is given by the equation $I_{bias}=I_{MN8}=[V_{CC}-V_{be}(Q10)-V_{gs}(MN8)]/R4$. Since each of the transistor pairs MN8 and MN9, MP4 and MP5, MN10 and MN5 have equal cross-sectional areas, $I_{MN5}=I_{MN8}=I_{bias}$. The current $I_{bias}$ is drawn through one or the other of NPN transistors Q6 and Q7.

When an ECL differential input signal is applied to input terminals 22a and 22b, the bias current $I_{bias}$ will be steered through either transistor Q6 or transistor Q7 depending upon the polarity of the differential input signal. If input terminal 22b is positive with respect to input terminal 22a, transistor Q6 turns off and transistor Q7 conducts the bias current $I_{bias}$. The collector of transistor Q6 is pulled high and approaches $V_{cc}$. The voltage at the emitter of transistor Q8, $V_e(Q8)$, is equal to $V_{cc}-V_{be}(Q8)$. This high value of $V_e(Q8)$ is applied to inverter 24 which, in turn, pulls the output voltage $V_{out}$ at terminal 26 low to ground.

If, on the other hand, input terminal 22a is positive with respect to input terminal 22b, transistor Q7 turns off and transistor Q6 conducts the bias current $I_{bias}$. The collector of transistor Q6 is thus pulled low. The voltage $V_e(Q8)$ will be equal to $V_{cc}-[I_{MN5}*R3]-V_{be}(Q8)\approx V_{gs}(MN8)$. This low value of $V_e(Q8)$ is applied to inverter 24 which, in turn, pulls the output voltage $V_{out}$ at terminal 26 high to approximately $V_{cc}$.

As explained above, the upper and lower limits of $V_e(Q8)$ are $V_{cc}-V_{be}(Q8)$ and $V_{gs}(MN8)$, respectively, irrespective of any variations in the supply voltage $V_{cc}$. Bias circuit 28 maintains these upper and lower limits by adjusting the bias current $I_{bias}$, and hence the operating point of transistors Q6 and Q7, in response to fluctuations in $V_{cc}$. Bias circuit 28 increases $I_{bias}$ when $V_{cc}$ increases and, conversely, decreases $I_{bias}$ when $V_{cc}$ decreases. These upper and lower limits for the voltage levels at the emitter of Q8 suppress DC current flow and ensure the proper operation of a load, such as a BiCMOS buffer, connected to output terminal 26. Note that the lower limit for $V_e(Q8)$ is determined and thus may be controlled by the device parameters of transistor MN8, i.e., $V_{gs}(MN8)$.

Figure 1:
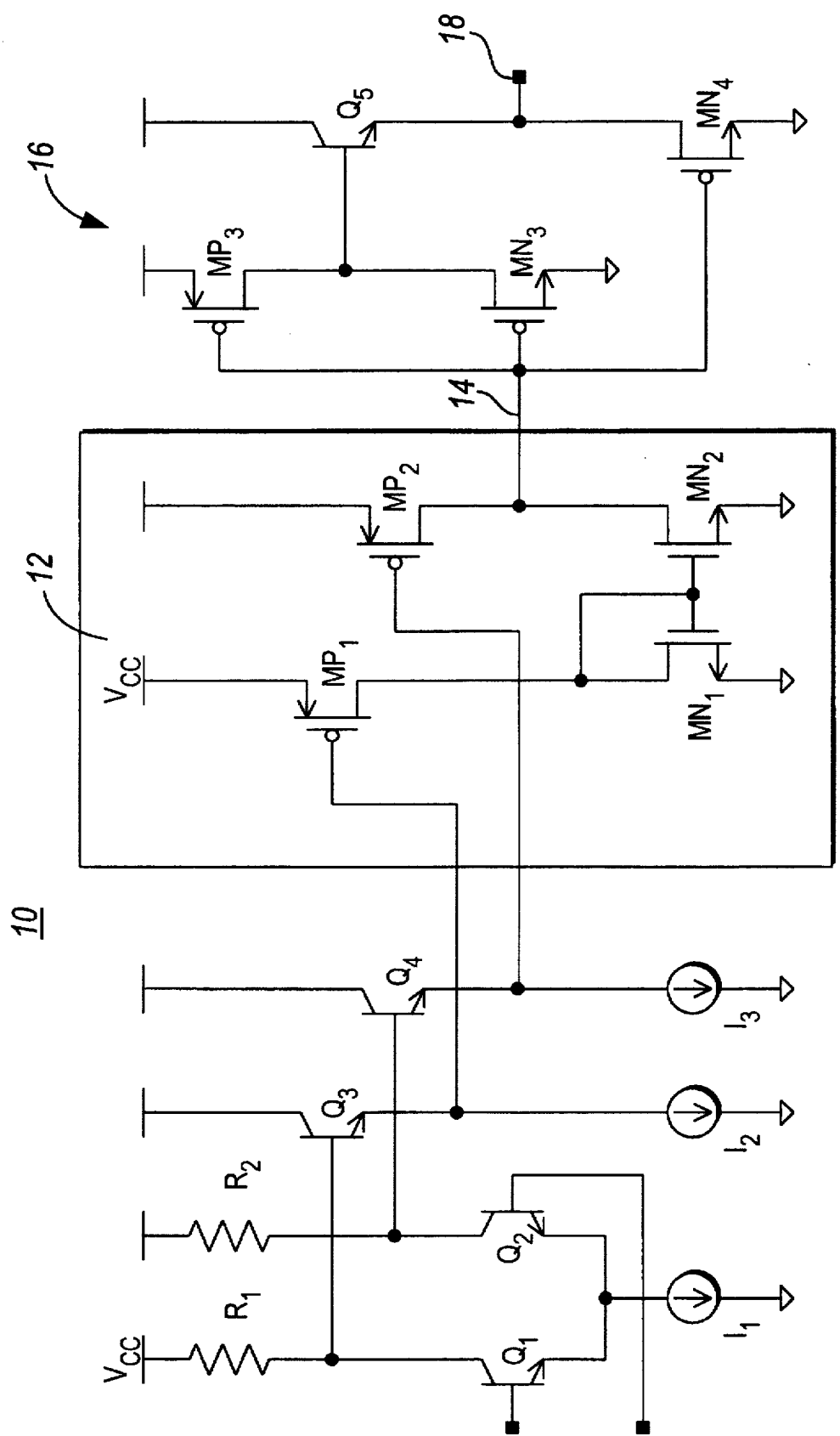
FIG. 1 is a schematic diagram of a conventional BiCMOS level translator.

The embodiment described above with respect to FIG. 2 achieves a reduction in power consumption compared to conventional level translators. Referring again to the conventional level translator 10 in FIG. 1, the DC current path between $V_{cc}$ and ground via transistors MP1 and MN1 in current mirror 12 account for a significant portion of the total power consumption of level translator 10. Since each conventional level translator 10 requires its own current mirror 12, increasing the number of level translators 10 by a factor of K requires increasing the number of current mirrors 12 by a factor of K and, therefore, results in the power dissipation attributable to losses in current mirror 12 also increasing by a factor of K.

In accordance with the present invention, on the other hand, such a current mirror is not required. A single bias circuit 28, which accounts for a significant portion of the total power dissipation of level translator 20, may be used to bias the differential amplifiers (i.e., transistors Q6 and Q7) of more than one level translator 20. Increasing the number of level translators 20 by a factor of K does not require any additional bias circuits 28 and, thus, does not increase power dissipation due to losses in bias circuit 28 by a factor of K. Thus, in applications which require a large number of level translators, an economy of scale with respect to power dissipation is achieved by the present invention, thereby giving level translator 20 better power dissipation than conventional level translators. Further, since bias circuit 28 may bias numerous differential amplifiers, significant savings in valuable die area can be achieved in those applications which require multiple level translators.

Moreover, since level translator 20 does not require a current mirror between the differential input stage and the inverter circuit, as does conventional level translator 10 (FIG. 1), delays associated with the current mirror are eliminated and, thus, the speed of level translator 20 is increased over conventional level translators 10.

In order to ensure the proper operation of level translator 20, the differential pair transistors Q6 and Q7 should not be allowed to operate in saturation. When transistor Q6 is on, its collector voltage will be equal to $V_{gs}(MN8)+V_{be}(Q8)$. Thus, the base voltage of transistor Q6 (and hence the voltage at input terminal 22a), should not exceed $[V_{gs}(MN8)+V_{be}(Q8)]$ by more than a few tenths of a volt.

In SRAM and logic applications, the ECL signal provided to input terminal 22a may exceed the voltage $[V_{gs}(MN8)+V_{be}(Q8)]$, which represents the collector voltage of Q6, by more than a few tenths of a volt, thereby undesirably saturating transistor Q6. In such an environment, a buffer which adjusts the level of the ECL signal may need to be connected between the ECL signal and level translator 20.

Figure 3:
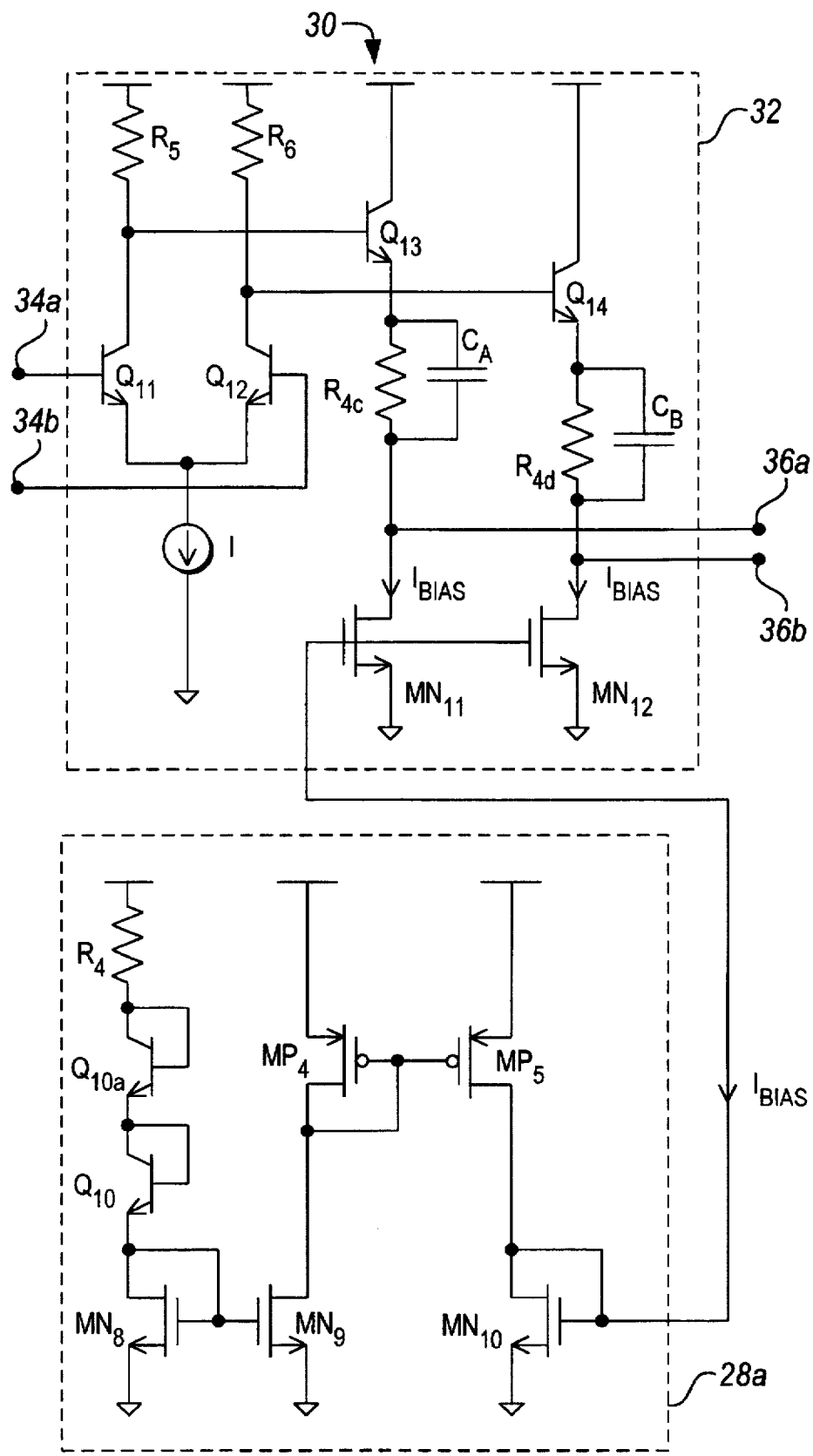
FIG. 3 is a schematic diagram of a level shifter in accordance with the present invention.

FIG. 3 shows such a buffer 30 including a level shift circuit 32 and a bias circuit 28a. A differential ECL input signal is provided to level shift circuit 32 at input terminals 34a and 34b. The voltage swing of the generated ECL signal, which appears as two single-ended components at the collectors of transistors Q11 and Q12, respectively, is set to be a few tenths of a volt by adjusting the values of the switching current I and resistors R5 and R6. These two single-ended components of the ECL signal pass through parallel-connected drop resistor R4c and speed-up capacitor CA and parallel-connected drop resistor R4d and speed-up capacitor CB, respectively, and are provided at terminals 36a and 36b, respectively. Speed-up capacitors CA and CB allow AC components of the two single-ended components to bypass resistors R4c and R4d, respectively. Output terminals 36a and 36b are connected to input terminals 22a and 22b, respectively, of level translator 20.

Bias circuit 28a, which is nearly identical to and operates in the same manner as bias circuit 28 (see FIG. 2), provides a bias current $I_{bias}$ to level shift circuit 32 via transistors MN11 and MN12. While bias circuit 28 of level translator 20 (FIG. 2) includes diode Q10, bias circuit 28a of buffer 30 (FIG. 3) includes two series connected diodes Q10 and Q10a. Diodes Q10 and Q10a are of identical structure such that $I_{bias}=[V_{cc}-2V_{be}(Q10)-V_{gs}(MN8)]/R4$. Resistors R4, R4c, and R4d have the same resistance values. The current $I_{bias}$ is mirrored in transistors MN11 and MN12 of level shift circuit 32, thereby resulting in a voltage drop of $V_{cc}-2V_{be}(Q10)-V_{gs}(MN8)$ across resistors R4c and R4d. Thus, the high voltage level of the ECL signal provided at output terminals 36a and 36b of buffer 30 is a few tenths of a volt lower than $V_{cc}-V_{be}(Q13)$ and the low voltage level is a few tenths of a volt lower than $V_{be}(Q10)+V_{gs}(MN8)$. This ECL signal provided at output terminals 36a and 36b can be applied to input terminals of 22a and 22b of the level translator 20 (FIG. 2) without saturating transistors Q6 and Q7.

It is to be noted that the forward bias emitter-base voltages of the above-mentioned bipolar transistors are assumed to be substantially equal.

The preferred embodiment has been described above in the context of an ECL to BiCMOS level translator. However, it is to be understood that the present invention is not limited to ECL to BiCMOS level translators but rather may be implemented in the context of other level translators, e.g., ECL to TTL and ECL to CMOS.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A current source comprising:
   a diode element having an anode and a cathode;
   a resistive element having a first end connected to a first voltage source and a second end connected to said cathode of said diode element;
   a first transistor having a drain coupled to said anode of said diode, a source coupled to a second voltage source, and a gate coupled to said drain;
   a second transistor having a gate coupled to said gate of said first transistor and having a source coupled to said second voltage source;
   a third transistor having a drain and a gate coupled together and to a drain of said second transistor and having a source coupled to said first voltage source;
   a fourth transistor having a gate coupled to said gate of said third transistor and having a source coupled to said first voltage source;
   a fifth transistor having a gate and a drain coupled together and to a drain of said fourth transistor and having a source coupled to said second voltage source; and
   a sixth transistor having a source coupled to said second voltage source, a gate coupled to said gate of said fifth transistor, and a drain coupled to an input stage of a circuit.

2. The structure of claim 1, wherein said diode element comprises a diode-connected transistor.

3. The structure of claim 1, wherein said diode element comprises a series combination of a plurality of diode-connected transistors.

4. The structure of claim 3, wherein said transistors are MOS devices.

5. The structure of claim 1, wherein said second voltage source is ground potential.

6. The structure of claim 1, wherein said second voltage source is less than zero.

* * * * *